United States Patent
Lai et al.

(10) Patent No.: US 10,845,835 B1
(45) Date of Patent: Nov. 24, 2020

(54) VOLTAGE REGULATOR DEVICE AND CONTROL METHOD FOR VOLTAGE REGULATOR DEVICE

(71) Applicant: Winbond Electronics Corp., Taichung (TW)

(72) Inventors: Jyun-Yu Lai, Taichung (TW); Hsing-Yu Liu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/562,394

(22) Filed: Sep. 5, 2019

(51) Int. Cl.
*G11C 5/14* (2006.01)
*G05F 1/575* (2006.01)

(52) U.S. Cl.
CPC .............. *G05F 1/575* (2013.01); *G11C 5/147* (2013.01)

(58) Field of Classification Search
CPC ..... G11C 16/0483; G11C 16/12; G11C 5/145; G11C 11/4113; G11C 11/417; G11C 5/143; G11C 5/147; G11C 16/30
USPC ............. 365/185.19, 185.18, 189.09, 189.07
See application file for complete search history.

(56) References Cited

U.S. PATENT DOCUMENTS

| | | | |
|---|---|---|---|
| 6,201,375 B1 | 3/2001 | Larson et al. | |
| 7,221,213 B2 | 5/2007 | Lee et al. | |
| 7,274,177 B2 | 9/2007 | Huang et al. | |
| 8,072,198 B2 | 12/2011 | Imura | |
| 9,753,476 B1 | 9/2017 | Shukla et al. | |
| 2010/0156362 A1 | 6/2010 | Xie | |
| 2013/0083573 A1* | 4/2013 | Ryu, II | H02M 3/07 363/60 |

FOREIGN PATENT DOCUMENTS

| | | |
|---|---|---|
| TW | 201239887 | 10/2012 |
| TW | 201439707 | 10/2014 |
| TW | 201626129 | 7/2016 |
| WO | 2017133356 | 8/2017 |

OTHER PUBLICATIONS

"Office Action of Taiwan Counterpart Application", dated Jan. 15, 2020, p. 1-p. 6.

* cited by examiner

*Primary Examiner* — Thong Q Le
(74) *Attorney, Agent, or Firm* — JCIPRNET

(57) ABSTRACT

A voltage regulator device and a control method thereof are provided. The voltage regulator device includes a voltage regulator and a path switch. The voltage regulator includes an output node and a voltage divider circuit. The output node is used to generate a control voltage. The voltage divider circuit generates an overshoot reference voltage according to an input voltage. A first node of the path switch is coupled to the output node, a second node of the path switch is coupled to a reference voltage node, and a control node of the path switch receives the overshoot reference voltage. When the control voltage is greater than the sum of the overshoot reference voltage and a threshold voltage of the path switch, the path switch is turned on to direct a charge at the output node to the reference voltage node.

11 Claims, 4 Drawing Sheets

VOLTAGE REGULATOR DEVICE AND CONTROL METHOD FOR VOLTAGE REGULATOR DEVICE

BACKGROUND

1. Technical Field

The disclosure relates to a voltage regulator technology and in particular relates to a voltage regulator device adapted to a cache memory and a control method for the voltage regulator device.

2. Description of Related Art

In an NOR cache memory technology, a voltage regulator is mainly used for regulating a pumping voltage higher than a working voltage to generate a control voltage for a cache memory to successfully perform corresponding operations, such as reading, writing-in, setting, programming, and erasing operations. Therefore, voltage regulators are expected to be designed to rapidly increase the control voltage and keep the control voltage stable.

However, it is difficult for an output node of a known voltage regulator to release charges, and misjudgment is thereby likely to occur during some part of the operation of the cache memory. For example, the control voltage generated by the voltage regulator is likely to affect a verification result of a memory cell, causing misoperation during a post-program (Post-PGM) operation.

SUMMARY

The disclosure provides a voltage regulator device applied to a cache memory and a control method of the voltage regulator device, so that an output node of the voltage regulator device has relatively high charge release efficiency under a specific situation.

The voltage regulator device in the embodiment of the disclosure comprises a voltage regulator and a path switch. The voltage regulator comprises an output node and a voltage divider circuit. The output node is used for generating a control voltage. The voltage divider circuit generates an overshoot reference voltage according to an input voltage. A first node of the path switch is coupled to the output node, a second node of the path switch is coupled to a reference voltage node, and a control node of the path switch receives the overshoot reference voltage. When the control voltage is greater than the sum of the overshoot reference voltage and a threshold voltage of the path switch, the path switch is turned on to direct a charge at the output node to the reference voltage node.

A control method of the voltage regulator device in the embodiment of the disclosure comprises the following steps. A path switch is arranged, wherein a first node of the path switch is coupled to an output node, and a second node of the path switch is coupled to a reference voltage node. An overshoot reference voltage is generated by virtue of a voltage divider circuit, wherein a control node of the path switch receives the overshoot reference voltage. Whether the control voltage is greater than the sum of the overshoot reference voltage and a threshold voltage of the path switch or not is judged. When the control voltage is greater than the sum of the overshoot reference voltage and the threshold voltage of the path switch, the path switch is turned on to direct a charge at the output node to the reference voltage node.

Based on the above, according to the voltage regulator device and the control method thereof in the embodiment of the disclosure, the path switch is arranged at the output node of the voltage regulator device, the overshoot reference voltage is generated by virtue of the voltage divider circuit in the voltage regulator device, and the overshoot reference voltage and the control voltage at the output node are compared by virtue of physical characteristics of the path switch. When the control voltage is greater than the sum of the overshoot reference voltage and the threshold voltage of the path switch, during the post-PGM operation of the cache memory, a memory cell of the cache memory has an overshot phenomenon. At the moment, the path switch is turned on to direct the charge at the output node to the reference voltage node, and thus, the output node of the voltage regulator device has relatively high charge release efficiency. Correspondingly, when the control voltage is not greater than the sum of the overshoot reference voltage and the threshold voltage of the path switch, the path switch is turned off to maintain the charge at the output node. Therefore, the voltage regulator device ensure that the output node has relatively high charge release efficiency under a specific situation.

In order to make the aforementioned and other objectives and advantages of the disclosure comprehensible, embodiments accompanied with figures are described in detail below.

DESCRIPTION OF THE EMBODIMENTS

Figure 1:
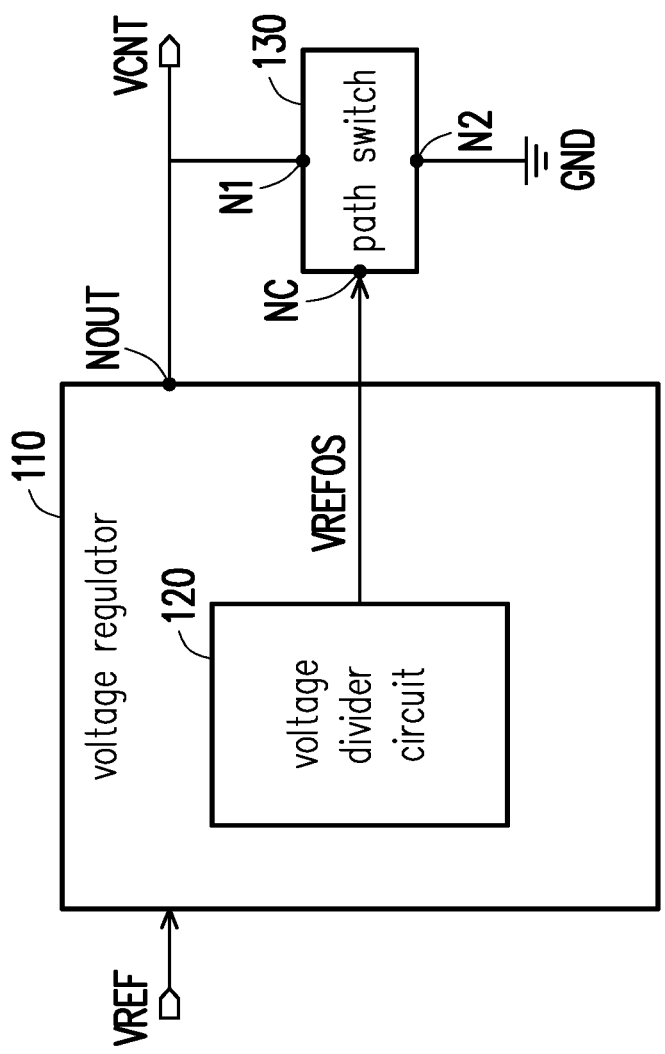
FIG. 1 is a schematic diagram of a voltage regulator device according to one embodiment of the disclosure.

FIG. 1 is a schematic diagram of a voltage regulator device 100 according to one embodiment of the disclosure. The voltage regulator device 100 is applied to a control device for a cache memory. The cache memory is a logic NOR-type cache memory or a logic NAND-type cache memory. The voltage regulator device 100 is mainly used for regulating a pumping voltage higher than a working voltage to generate a control voltage VCNT, and therefore, the cache memory successfully performs corresponding operation. A person who applies the present embodiment also applies the voltage regulator device in the embodiment of the disclosure to other technologies as required, such as a control device of other types of memory components (such as a resistive random access memory (RRAM), a ferroelectric random access memory (FeRAM) and a magnetoresistive random access memory (MRAM)).

The voltage regulator device 100 in the present embodiment includes a voltage regulator 110 and a path switch 130. The voltage regulator 110 generates the control voltage VCNT according to a reference voltage VREF. The voltage regulator 110 includes an output node NOUT and a voltage divider circuit 120. The output node NOUT is used for generating the control voltage VCNT. The voltage divider circuit 120 generates an overshoot reference voltage VREFOS according to an input voltage. A person who applies the present embodiment regulates a voltage value of the overshoot reference voltage VREFOS as required, for example, the voltage value of the overshoot reference voltage VREFOS is designed based on the overshoot situation of a memory cell under the post-program operation of the cache memory in the present embodiment, and thus, whether the overshoot situation of the memory cell happens or not is judged by virtue of the overshoot reference voltage VREFOS.

A first node N1 of the path switch 130 is coupled to the output node NOUT, a second node N2 of the path switch 130 is coupled to a reference voltage node (for example, a grounding voltage node (GND) in the present embodiment). A control node NC of the path switch 130 receives the overshoot reference voltage VREFOS. The path switch 130 is realized by virtue of a metal-oxide-semiconductor field-effect transistor (MOS), and the present embodiment is mainly realized by a P-type MOS. The path switch 130 realized by the P-type MOS has a threshold voltage Vth. In such a way, when the control voltage VCNT is greater than the sum of the overshoot reference voltage VREFOS and the threshold voltage Vth of the path switch 130 during the post-program operation of the cache memory, the path switch 130 is turned on to direct a charge at the output node NOUT to the reference voltage node (the GND). Correspondingly, when the control voltage VCNT is not greater than the sum of the overshoot reference voltage VREFOS and the threshold voltage Vth, the path switch 130 is turned off to maintain the charge at the output node NOUT.

Figure 2:
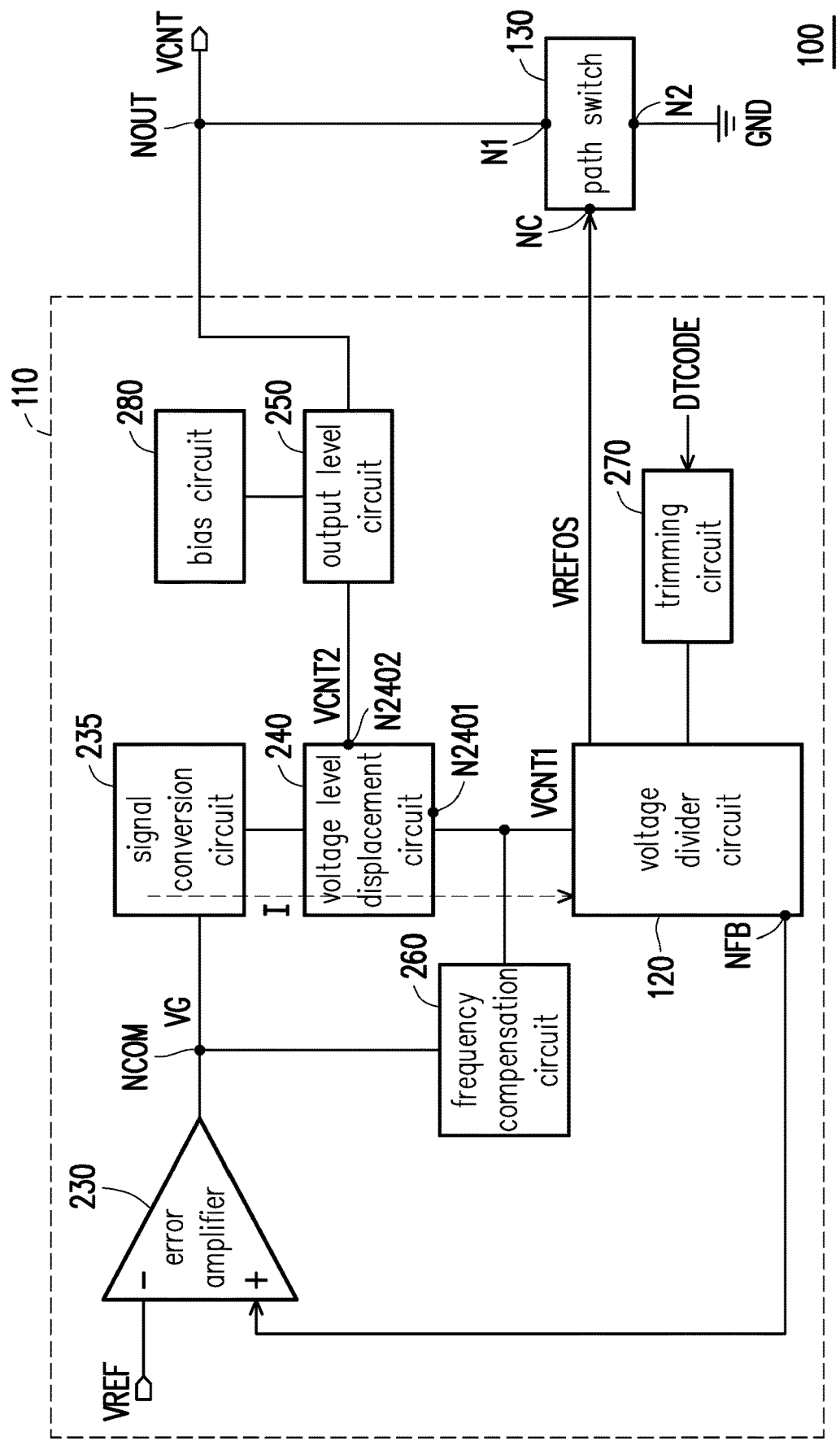
FIG. 2 is a block diagram of a voltage regulator device according to one embodiment of the disclosure.

FIG. 2 is a block diagram of the voltage regulator device 100 according to one embodiment of the disclosure. FIG. 2 is mainly used for explaining each component of the voltage regulator 110. The voltage regulator 110 further mainly includes an error amplifier 230, a signal conversion circuit 235, a voltage level displacement circuit 240 and an output level circuit 250 in addition to the voltage divider circuit 120. The voltage regulator 110 further includes a frequency compensation circuit 260, a trimming circuit 270 and a bias circuit 280.

The voltage divider circuit 120 further includes a feedback node NFB. A reversed-phase receiving node of the error amplifier 230 is coupled to the reference voltage VREF, and a non-reversed-phase receiving node of the amplifier 230 is coupled to the feedback node NFB. An input node of the signal conversion circuit 235 is coupled to a comparison output node NCOM of the error amplifier 230. The output level circuit 250 is coupled to the signal conversion circuit 235 by virtue of the voltage level displacement circuit 240, and an output node of the output level circuit 250 is coupled to the output node NOUT of the voltage regulator 110. The output level circuit 250 is further coupled to the bias circuit 280.

In the operation aspect of each component, the error amplifier 230 compares the reference voltage VREF and a voltage at the feedback node NFB so as to generate a comparison voltage VG at the comparison output node NCOM. The signal conversion circuit 235 converts a voltage signal into a current signal by virtue of a current mirror structure. For example, the comparison voltage VG is converted into a current I flowing through the signal conversion circuit 235, the voltage level displacement circuit 240 and the voltage divider circuit 120. The voltage divider circuit 120, the voltage level displacement circuit 240 and the signal conversion circuit 235 generate a first control voltage VCNT1 at a first node N2401 of the voltage level displacement circuit 240 according to the comparison voltage VG and generate a second control voltage VCNT2 at a second node N2402 of the voltage level displacement circuit 240. The voltage level displacement circuit 240 is used for performing voltage level displacement on the first control voltage VCNT1, so that the voltage level displacement circuit 240 and the output level circuit 250 eliminate variation generated by the control voltage VCNT due to process difference, which is described in detail in the following embodiments. The output level circuit 250 generates the control voltage VCNT according to the second control voltage VCNT2 and the bias circuit 280.

The frequency compensation circuit 260 is coupled between the comparison output node NCOM of the error amplifier 230 and the voltage divider circuit 120 and is used for compensating noise generated by the feedback node NFB. The trimming circuit 270 is coupled to the voltage divider circuit 120. The trimming circuit 270 is used for regulating voltage values of the first control voltage VCNT1 and the overshoot reference voltage VREFOS generated by the voltage divider circuit 120 according to a digital trimming code DTCODE. The detailed circuit diagram of the trimming circuit 270 refers to FIG. 3 and corresponding descriptions.

Figure 3:
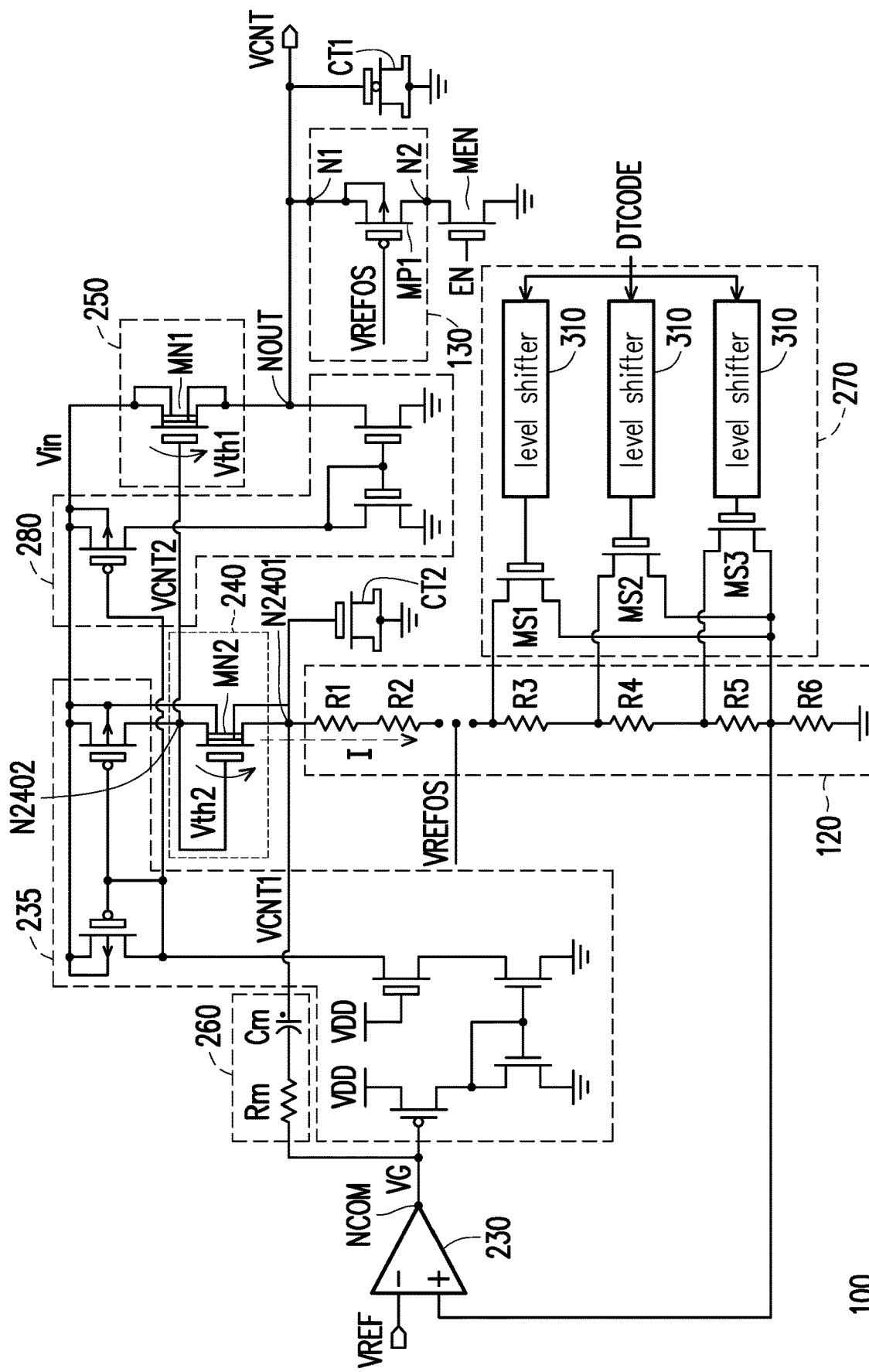
FIG. 3 is a circuit diagram of a voltage regulator device according to one embodiment of the disclosure.

FIG. 3 is a circuit diagram of the voltage regulator device 100 according to one embodiment of the disclosure. All relevant components in FIG. 1 and FIG. 2 are drawn in FIG. 3 and are realized by utilizing basic circuit components such as an MOS, a resistor, a capacitor and an amplifier. For example, the voltage divider circuit 120 is realized by a resistor string formed by mutually connecting a plurality of resistors R1-R6 in series; the path switch 130 is realized by a P-type MOS MP1; the signal conversion circuit 235 and the bias circuit 280 are realized by a plurality of N-type MOSs and P-type MOSs; the output level circuit 250 is realized by a source follower formed by an N-type MOS MN1; the frequency compensation circuit 260 is realized by a compensation resistor Rm and a compensation capacitor Cm which are mutually connected in series; the voltage level displacement circuit 240 is realized by an N-type MOS MN2, a source node of the MOS MN2 is used as the first node N2401 of the voltage level displacement circuit 240, and the source node and a gate node of the MOS MN2 are coupled to be used as the second node N2402 of the voltage level displacement circuit 240. Vin is the input voltage of the voltage regulator device 100, and VDD is the working voltage of the voltage regulator device 100.

The voltage regulator device 100 further includes a starting switch MEN. The second node N2 of the path switch 130 is coupled to the reference voltage node (such as the GND) by virtue of the starting switch MEN. The control node of the starting switch MEN receives a starting voltage EN. Therefore, when the voltage regulator device 100 is started, the starting switch MEN is turned on, so that noise interference caused when the voltage regulator device 100 is started is avoided.

The way in which the voltage level displacement circuit 240 and the output level circuit 250 eliminate variation generated by the control voltage VCNT due to process difference is described in detail herein. Referring to FIG. 3, the voltage value of the second control voltage VCNT2 is equal to a voltage value of the first control voltage VCNT1 plus a threshold voltage Vth2 of the N-type MOS MN2 in the voltage level displacement circuit 240, and a voltage value of the control voltage VCNT is equal to a voltage value obtained after a threshold voltage Vth1 of the N-type MOS MN1 in the output level circuit 250 is subtracted by the second control voltage VCNT2. Both the threshold voltage Vth1 of the N-type MOS MN1 and the threshold voltage Vth2 of the N-type MOS MN2 are relevant to the variation generated due to process difference, so that the threshold voltage Vth1 of the MOS MN1 is equal to the threshold voltage Vth2 of the MOS MN2 under the same process, and furthermore, process variation is eliminated.

The trimming circuit 270 is described in detail herein. The trimming circuit 270 is realized when a plurality of N-type MOSs (such as MOS MS1-MS3 in FIG. 3) serves as switches and a plurality of level shifters 310 shifts the digital trimming code DTCODE into analog voltages. The level shifters 310 shift the digital trimming code DTCODE into the analog voltages, and whether the N-type MOS MS1-MS3 are turned on or not is controlled by virtue of the analog voltages, so that the amount of the resistor string R1-R6 passed by the current is regulated, and based on this, the voltage values of the first control voltage CVNT1 and the overshoot reference voltage VREFOS are regulated. For example, when the N-type MOS MS1 is turned on and the N-type MOS MS2 and the N-type MOS MS3 are turned off, the resistors R1, R2 and R6 allow the current to pass, but the remaining resistors (such as the resistors R3-R5) do not allow the current to pass. Therefore, the overshoot reference voltage VREFOS becomes the following voltage value: VREFOS=VCNT1×R6/(R1+R2+R6) based on a voltage divider effect; and when all the N-type MOS MS1-MS3 are turned off, all the resistors R1-R6 allow the current to pass. Therefore, the overshoot reference voltage VREFOS becomes the following voltage value: VREFOS=VCNT1×(R3+R4+R5+R6)/(R1+R2+R3+R4+R5+R6) based on the voltage divider effect.

In order to effectively maintain the charges of the control voltage VCNT and the first control voltage VCNT1, the output node NOUT where the control voltage VCNT is located is provided with a first maintaining capacitor CT1, and a node where the first control voltage VCNT1 is located is provided with a second maintaining capacitor CT2.

Figure 4:
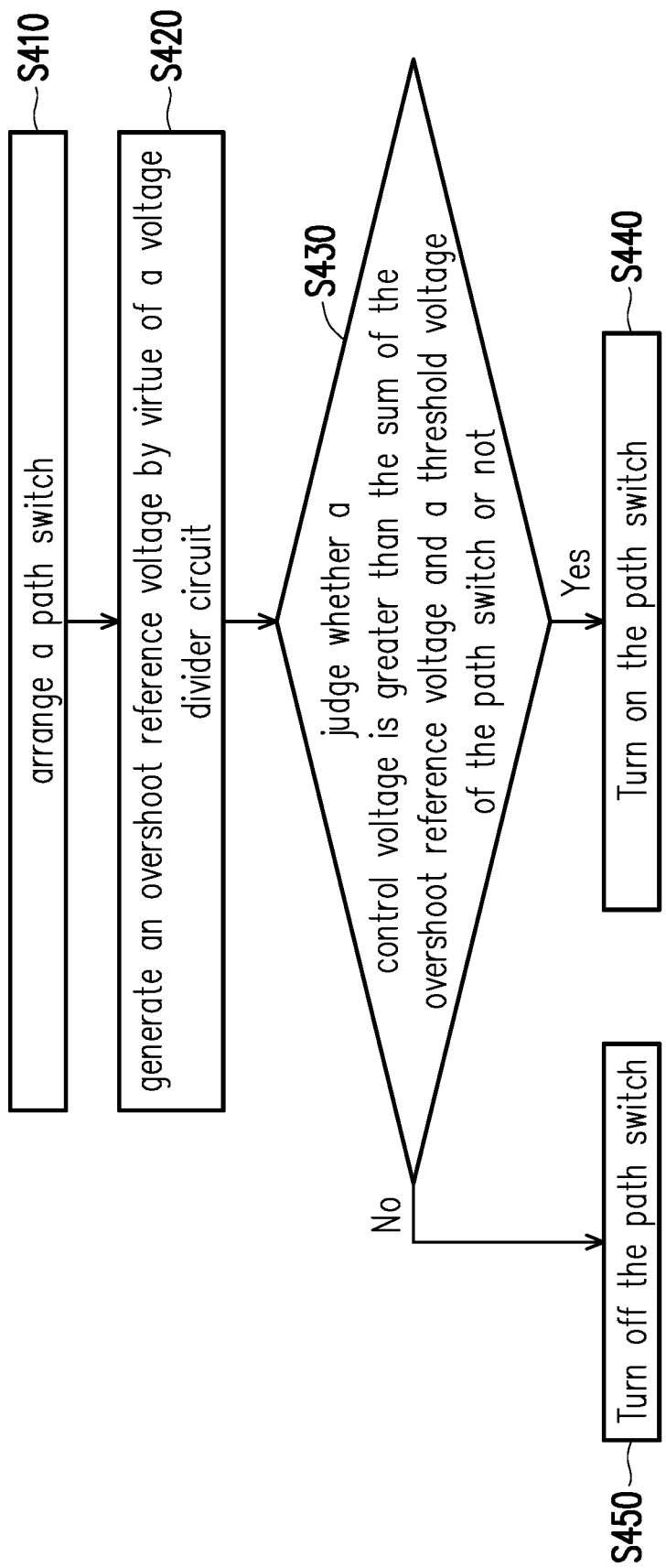
FIG. 4 is a flow diagram of a control method of a voltage regulator device according to one embodiment of the disclosure.

FIG. 4 is a flow diagram of a control method of the voltage regulator device 100 according to one embodiment of the disclosure. The voltage regulator device 100 adopted by the control method is described as FIG. 1 to FIG. 3. Referring to FIG. 1 and FIG. 4 at the same time, in step S410, a path switch 130 is arranged, wherein a first node N1 of the path switch 130 is coupled to an output node NOUT of the voltage regulator device 100, and a second node N2 of the path switch 130 is coupled to a reference voltage node (GND). In step S420, an overshoot reference voltage VREFOS is generated by virtue of a voltage divider circuit 120 of the voltage regulator device 100, and a control node NC of the path switch 130 receives the overshoot reference voltage VREFOS. In step S430, whether a control voltage VCNT at the output node NOUT is greater than the sum of the overshoot reference voltage VREFOS and a threshold voltage of the path switch 130 or not is judged by virtue of the path switch 130.

When the control voltage VCNT is greater than the sum of the overshoot reference voltage VREFOS and the threshold voltage of the path switch 130, step S440 is entered from Step S430, the path switch 130 is turned on to direct a charge at the output node NOUT to the reference voltage node (GND). Correspondingly, when the control voltage VCNT is not greater than the sum of the overshoot reference voltage VREFOS and the threshold voltage of the path switch 130, step S450 is entered from step 430, the path switch 130 is turned on to maintain the charge at the output node. The detailed steps of the operation method also refer to the embodiments and corresponding descriptions in FIG. 1 to FIG. 3.

Based on the above, according to the voltage regulator device and the control method thereof in the embodiments of the disclosure, the path switch is arranged at the output node of the voltage regulator device, the overshoot reference voltage is generated by virtue of the voltage divider circuit in the voltage regulator device, and the overshoot reference voltage and the control voltage at the output node are compared by virtue of the physical characteristics of the path switch. When the control voltage is greater than the sum of the overshoot reference voltage and the threshold voltage of the path switch, during the post-PGM operation of the cache memory, the memory cell of the cache memory has an overshot phenomenon. At the moment, the path switch is turned on to direct the charge at the output node to the reference voltage node, and thus, the output node of the voltage regulator device has relatively high charge release efficiency. Correspondingly, when the control voltage is not greater than the sum of the overshoot reference voltage and the threshold voltage of the path switch, the path switch is turned off to maintain the charge at the output node. Therefore, the voltage regulator device ensures that the output node has relatively high charge release efficiency under a specific situation.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A voltage regulator device, comprising:
   a voltage regulator, comprising:
      an output node, generating a control voltage; and
      a voltage divider circuit, generating an overshoot reference voltage according to an input voltage; and
   a path switch, wherein a first node of the path switch is coupled to the output node, a second node of the path switch is coupled to a reference voltage node, and a control node of the path switch receives the overshoot reference voltage,
   wherein the path switch is turned on to direct a charge at the output node to the reference voltage node when the control voltage is greater than a sum of the overshoot reference voltage and a threshold voltage of the path switch, wherein whether the control voltage is greater than a sum of the overshoot reference voltage and a threshold voltage of the patch switch is judged by virtue of the path switch.

2. The voltage regulator device according to claim 1, wherein the voltage regulator device is used in a control device for a cache memory, and
   the path switch is turned on based on a condition that the control voltage is greater than the sum of the overshoot reference voltage and the threshold voltage during a post-program operation of the cache memory.

3. The voltage regulator device according to claim 1, wherein the path switch is turned off when the control voltage is not greater than the sum of the overshoot reference voltage and the threshold voltage.

4. The voltage regulator device according to claim 1, wherein the voltage divider circuit further comprises a feedback node,
   the voltage regulator further comprises:

an error amplifier, comprising a reversed-phase receiving node coupled to a reference voltage, and a non-reversed-phase receiving node coupled to the feedback node;

a signal conversion circuit, comprising an input node coupled to a comparison output node of the error amplifier;

a voltage level displacement circuit and a bias circuit; and an output level circuit, coupled to the signal conversion circuit by virtue of the voltage level displacement circuit, and coupled to the output node and the bias circuit, wherein the voltage divider circuit, the voltage level displacement circuit, and the signal conversion circuit generate a first control voltage at a first node of the voltage level displacement circuit and generate a second control voltage at a second node of the voltage level displacement circuit according to a comparison voltage, the voltage level displacement circuit performs voltage level displacement on the first control voltage, and the bias circuit provides a bias to make the output level circuit normally operate, and the output level circuit generates the control voltage according to the second control voltage and the bias circuit.

5. The voltage regulator device according to claim 4, wherein a voltage value of the second control voltage is equal to a voltage value of the first control voltage plus a threshold voltage of a transistor in the voltage level displacement circuit, and a voltage value of the control voltage is equal to a voltage value obtained by subtracting a threshold voltage of a transistor in the output level circuit from the second control voltage.

6. The voltage regulator device according to claim 4, further comprising:

a frequency compensation circuit, coupled between the comparison output node of the error amplifier and the voltage divider circuit.

7. The voltage regulator device according to claim 4, further comprising:

a trimming circuit, coupled to the voltage divider circuit and regulating voltage values of the first control voltage and the overshoot reference voltage generated by the voltage divider circuit according to a digital trimming code.

8. The voltage regulator device according to claim 1, further comprising:

a starting switch, wherein the second node of the path switch is coupled to the reference voltage node by virtue of the starting switch, and a control node of the starting switch receives a starting voltage, wherein the starting switch is turned on when the voltage regulator device is started.

9. A control method of a voltage regulator device, comprising:

arranging a path switch, wherein a first node of the path switch is coupled to an output node of the voltage regulator device, and a second node of the path switch is coupled to a reference voltage node;

generating an overshoot reference voltage by virtue of a voltage divider circuit, wherein a control node of the path switch receives the overshoot reference voltage;

judging whether a control voltage at the output node is greater than a sum of the overshoot reference voltage and a threshold voltage of the path switch or not; and turning on the path switch to direct a charge at the output node to the reference voltage node when the control voltage is greater than the sum of the overshoot reference voltage and the threshold voltage of the path switch.

10. The control method according to claim 9, wherein the voltage regulator device is used in a control device for a cache memory, and the path switch is turned on based on a condition that the control voltage is greater than the sum of the overshoot reference voltage and the threshold voltage during a post-program operation of the cache memory.

11. The control method according to claim 9, further comprising:

turning off the path switch when the control voltage is not greater than the sum of the overshoot reference voltage and the threshold voltage of the path switch.

* * * * *